(12) United States Patent
Navarro et al.

(10) Patent No.: US 10,023,677 B2
(45) Date of Patent: Jul. 17, 2018

(54) METHOD FOR CONTROLLING THE SYNTHESIS OF A BLOCK COPOLYMER CONTAINING AT LEAST ONE NONPOLAR BLOCK AND AT LEAST ONE POLAR BLOCK AND USE OF SAID BLOCK COPOLYMER IN APPLICATIONS OF NANOLITHOGRAPHY BY DIRECT SELF-ASSEMBLY

(71) Applicant: Arkema France, Colombes (FR)

(72) Inventors: Christophe Navarro, Bayonne (FR); Celia Nicolet, Talence (FR); Xavier Chevalier, Grenoble (FR)

(73) Assignee: Arkema France, Colombes (FR)

( * ) Notice: Subject to any disclaimer, the term of this patent is extended or adjusted under 35 U.S.C. 154(b) by 0 days.

(21) Appl. No.: 14/971,661

(22) Filed: Dec. 16, 2015

(65) Prior Publication Data
US 2016/0168305 A1    Jun. 16, 2016

(30) Foreign Application Priority Data
Dec. 16, 2014   (FR) .................... 14 62556

(51) Int. Cl.
| | | |
|---|---|---|
| *C08F 297/02* | (2006.01) | |
| *C09D 153/00* | (2006.01) | |
| *G03F 7/00* | (2006.01) | |
| *G03F 7/004* | (2006.01) | |
| *B82Y 30/00* | (2011.01) | |

(52) U.S. Cl.
CPC .......... *C08F 297/026* (2013.01); *B82Y 30/00* (2013.01); *C09D 153/00* (2013.01); *G03F 7/0002* (2013.01); *G03F 7/004* (2013.01); *B81C 2201/0149* (2013.01)

(58) Field of Classification Search
CPC .. C08F 297/02; C08F 297/026; C08F 297/00; C09D 153/00; G03F 7/0002; G03F 7/004; B81C 2201/0149; B82Y 30/00
See application file for complete search history.

(56) References Cited

U.S. PATENT DOCUMENTS

| | | | | |
|---|---|---|---|---|
| 5,514,753 A | * | 5/1996 | Ozawa | ............... C08F 297/02 525/247 |
| 5,629,393 A | | 5/1997 | Varshney | |
| 5,686,534 A | | 11/1997 | Bayard | |
| 5,886,112 A | | 3/1999 | Vuillemin | |

FOREIGN PATENT DOCUMENTS

| | | |
|---|---|---|
| EP | 0524054 | 1/1993 |
| EP | 0749987 | 12/1996 |
| EP | 2829567 | 1/2015 |
| WO | 2015092241 | 6/2015 |

OTHER PUBLICATIONS

Borah, D. et al. Journal of Materials Chemistry C vol. 1 pp. 1192-1196 (Dec. 13, 2012).*
Chevalier, X., et al., "Scaling-down lithographic dimensions with block-copolymer materials: 10-nm-sized features with poly(styrene)—block-poly (methylmethacrylate)," Jul. 1, 2013, pp. 31102, vol. 12, No. 3, Journal of Micro/Nanolithography, MEMS, and MOEMS, SPIE—International Society for Optical Engineering, US (abstract only).
French Search Report dated Jul. 21, 2015 for French Application No. 1462556.
Gerner, F.J., et al., "On the termination reaction in the anionic polymerization of methyl methacrylate in polar solvents—I. Kinetic Studies," 1984, pp. 349-355, vol. 20, No. 4, European Polymer Journal (abstract only).
Wiles, D.M. et al., "Polymerization of methyl methacrylate initiated by I, 1-diphenylhexyl lithium," Jul. 24, 1964, pp. 150-158, vol. 61, Transactions of the Faraday Society (abstract only).

* cited by examiner

*Primary Examiner* — Irina S Zemel
*Assistant Examiner* — Jeffrey S Lenihan
(74) *Attorney, Agent, or Firm* — RatnerPrestia

(57) ABSTRACT

A method for controlling the synthesis of a block copolymer containing at least two blocks, with at least one nonpolar block and at least one polar block, said method making it possible in particular to control the ratio between the blocks and the molecular weight of each of the blocks, said copolymer being a block copolymer intended to be used as a mask in a method of nanolithography by direct self-assembly (DSA), said control being achieved by semicontinuous anionic polymerization in an aprotic nonpolar medium.

14 Claims, 2 Drawing Sheets

METHOD FOR CONTROLLING THE SYNTHESIS OF A BLOCK COPOLYMER CONTAINING AT LEAST ONE NONPOLAR BLOCK AND AT LEAST ONE POLAR BLOCK AND USE OF SAID BLOCK COPOLYMER IN APPLICATIONS OF NANOLITHOGRAPHY BY DIRECT SELF-ASSEMBLY

CROSS-REFERENCE TO RELATED APPLICATION

This application claims priority to French Application No. 1462556, filed Dec. 16, 2014, the entire disclosure of which is incorporated herein by reference for all purposes.

FIELD OF THE INVENTION

The present invention relates to the field of nanostructured block copolymers having nanodomains oriented in a particular direction and intended to be used in applications of nanolithography by direct self-assembly, also known by the acronym DSA.

More particularly, the invention relates to a method for controlling the synthesis of a block copolymer containing at least one nonpolar block and at least one polar block, such as, for example, polystyrene-b-poly(methyl methacrylate), designated hereunder PS-b-PMMA, to said block copolymer synthesized in a controlled manner and to the use of said block copolymer as a mask in a method of nanolithography by direct self-assembly.

BACKGROUND OF THE RELATED ART

The development of nanotechnologies has enabled continual miniaturization of products in the field of microelectronics and notably micro-electromechanical systems (MEMS). The conventional lithography techniques are now no longer able to meet these constant needs for miniaturization, as they do not allow structures to be produced with dimensions under 60 nm.

It has therefore been necessary to adapt the lithography techniques and create etching masks that make it possible to create ever smaller patterns at high resolution. With block copolymers it is possible to structure the arrangement of the constituent blocks of the copolymers, by phase segregation between the blocks thus forming nanodomains, at scales that may be under 50 nm. Owing to this capacity for self-nano-structuring, the use of block copolymers in the fields of electronics or optoelectronics is now well known.

Among the masks investigated for carrying out nanolithography, films of block copolymers, notably containing at least two blocks, with at least one nonpolar block and at least one polar block, for example based on PS-b-PMMA, appear to be very promising solutions as they make it possible to create patterns with good resolution. For such a block copolymer film to be usable as an etching mask, a block of the copolymer must be selectively removed to create a porous film of the residual block, the patterns of which can subsequently be transferred by etching to an underlying layer. For film of PS-b-PMMA, the PMMA (poly(methyl methacrylate)) is usually removed selectively to create a mask of residual PS (polystyrene).

To create such masks, the nanodomains must be oriented parallel or perpendicular to the surface of the underlying layer. Such structuring of the domains requires particular conditions such as preparation of the surface of the underlying layer, but also the composition of the block copolymer.

Thus, the ratios between the blocks of PS and of PMMA make it possible to control the morphology of the nanodomains, i.e. arrangement of the nanodomains in the form of lamellae, cylinders, or spheres for example, and the molecular weight of each block makes it possible to control the size and the spacing of the blocks, i.e. the period $L_0$ of the block copolymer.

So as to be able to fabricate miniature microelectronic or optoelectronic devices industrially, it becomes crucial to synthesize the block copolymers, forming the masks intended for nanolithography by direct self-assembly, reproducibly, so that each mask meets precise specifications, and notably has nanodomains whose form, size and period are controlled.

Synthesis of the block copolymers containing at least one polar block, such as, for example, PMMA, traditionally requires working in a polar solvent, to avoid precipitation of the polymer during synthesis, which leads to poor control of its architecture.

Synthesis of the block copolymers containing at least one nonpolar block and at least one polar block, such as, for example, of the PS-b-PMMA type, is traditionally carried out by anionic polymerization in THF (tetrahydrofuran) at low temperature, generally at a temperature below −70° C.

The first example of polymerization of styrene in THF at low temperature dates back to 1956. This polymerization, using naphthalenesodium as initiator, took place suitably, without a transfer reaction, as described by M. Swarc in "living polymers", Nature (London) 1956; 178: 1168.

The document with the title "On the termination reaction in the anionic polymerization of methylmethacrylate in polar solvents", Eur. Polym, Vol. 20, No. 4, pages 349-355, 1984, investigates the kinetics of the termination reaction, during which the active centers are destroyed, in the anionic polymerization of methyl methacrylate MAM in THF at a temperature less than or equal to −75° C. This document is not, however, interested in control of the synthesis of PS-b-PMMA block copolymers intended to be used as masks in applications of nanolithography by direct self-assembly.

However, synthesis of PS-b-PMMA block copolymers in THF poses problems of industrialization owing to the difficulty of being able to store THF at industrial sites. As this polar solvent is a cyclic ether, once purified it has a tendency to oxidize over time to form potentially explosive peroxides. Moreover, synthesis at low temperature represents a large energy cost. Finally, the use of a polar solvent such as THF, which is a hygroscopic solvent that is difficult to render anhydrous, and an alkyllithium, for example sec-butyl-lithium, which is a very reactive initiator, makes it difficult to stabilize the synthesis conditions from one batch to another. Consequently, the reproducibility of the PS-b-PMMA copolymers synthesized in THF at low temperature does not appear to be sufficient to be able to use these copolymers as masks for nanolithography by direct self-assembly with a view to fabricating miniature electronic and/or optoelectronic devices.

Routes have been investigated for replacing THF with some other solvent in the polymerization of methyl methacrylate MAM. Thus, the document with the title "Polymerization of Methyl Methacrylate initiated by 1,1-Diphenyl-Hexyl Lithium", Trans. Faraday Soc., 1965, 61, pages 150-158, investigates the anionic polymerization of MAM in toluene at a temperature between 0° C. and −80° C., using 1,1DPHLi (DiPhenylHexyl Lithium) as initiator of the polymerization reaction. However, this document is not interested, either, in controlling the synthesis of block copolymers containing at least one nonpolar block and at least one polar block, such as, for example, PS-b-PMMA intended to be used as masks in applications of nanolithography by direct self-assembly, with a view to improving its reproducibility.

Furthermore, the applicant investigated, in document EP 0 749 987, the continuous polymerization of meth(acrylic) monomers in a nonpolar solvent, and notably in toluene at −20° C., with an initiator mixed with an alkali metal alcoholate. The initiator/alcoholate mixture and the monomer(s) to be polymerized are mixed, with a flow ratio that is kept constant, in a micro-mixer arranged upstream of a (co)polymerization reactor. The method for continuous polymerization described in this document makes it possible to control the kinetics of the polymerization reaction of meth(acrylic) monomers, which is very quick, so that it makes it possible to reduce the impact of secondary reactions, by consuming the monomer very quickly. This document is not interested in PS-b-PMMA block copolymers intended to be used as masks in applications of nanolithography by direct self-assembly, nor in controlling their synthesis with a view to improving their reproducibility, notably in terms of the ratio between the blocks and the molecular weight of each of the blocks.

Because the PS-b-PMMA block copolymers make it possible to produce masks for nanolithography offering good resolution, the applicant searched for a solution for controlling their synthesis in order to be able to control the morphology of the nanodomains, and notably their shape, their size and their period and thus improve their reproducibility.

SUMMARY OF THE INVENTION

The invention therefore aims to overcome at least one of the drawbacks of the prior art. The invention notably aims to propose a method for controlling the synthesis in an aprotic nonpolar medium, of a block copolymer containing at least two blocks, with at least one nonpolar block and at least one polar block, for example of PS-b-PMMA, intended to be used as a mask in a method of nanolithography by direct self-assembly, which makes it possible to obtain a block copolymer reproducibly and repeatably over time, with nanodomains having shapes, sizes and periods corresponding to precise specifications for application as a mask for which the block copolymer is intended.

The invention further relates to a block copolymer containing at least two blocks, with at least one nonpolar block and at least one polar block, for example of PS-b-PMMA, intended to be used as a mask in a method of nanolithography by direct self-assembly, in which the ratio between the nonpolar and polar blocks, such as PS and PMMA, is controlled so as to be able to obtain nanodomains with desired morphologies.

The invention also aims to propose the use of a film of said block copolymer, whose properties are controlled, in a method of nanolithography by direct self-assembly.

Surprisingly, it was discovered that a method for controlling the synthesis of a block copolymer containing at least two blocks, with at least one nonpolar block and at least one polar block, said method making it possible in particular to control the ratio between the blocks and the molecular weight of each of the blocks, said copolymer being a block copolymer intended to be used as a mask in a method of nanolithography by direct self-assembly (DSA), said control being achieved by semicontinuous anionic polymerization in an aprotic nonpolar medium and comprising the following steps:

synthesizing a first nonpolar block in the form of a macro-initiator, preparing a solution of said macro-initiator previously synthesized by mixing it with an alkali metal alcoholate in an aprotic nonpolar solvent, preparing a solution of a polar monomer in an aprotic nonpolar solvent, injecting the two solutions previously prepared of macro-initiator and of polar monomer into a micro-mixer, connected to a polymerization reactor, at a constant flow ratio, recovering the copolymer obtained, makes it possible to obtain, with increased reproducibility, nonpolar-b-polar block copolymers of the PS-b-PMMA type whose nanodomains have controlled properties, notably in terms of shapes, sizes and periods, and meet precise specifications, so that the block copolymers can be used industrially as masks in methods of nanolithography by direct self-assembly (DSA).

The invention further relates to a block copolymer containing at least two blocks, with at least one nonpolar block and at least one polar block, intended to be used as a mask in a method of nanolithography by direct self-assembly (DSA), said block copolymer being synthesized in a controlled manner according to the method of control described above, and having nanodomains in the form of lamellae when the nonpolar block/polar block weight ratio is between 35/65 and 60/40 and in the form of cylinders when the nonpolar block/polar block weight ratio is between 64/36 and 75/25 or between 25/75 and 36/64.

The invention finally relates to the use of a film of the block copolymer containing at least two blocks, with at least one nonpolar block and at least one polar block, as a mask in a method of nanolithography by direct self-assembly (DSA), said film of the block copolymer being synthesized in a controlled manner according to the method of control described above.

DESCRIPTION OF THE FIGURES

Other particular features and advantages of the invention will become clear on reading the description given as an illustrative, nonlimiting example, referring to the appended figures, which show.

DETAILED DESCRIPTION OF THE CERTAIN EMBODIMENTS OF THE INVENTION

Figure 1:
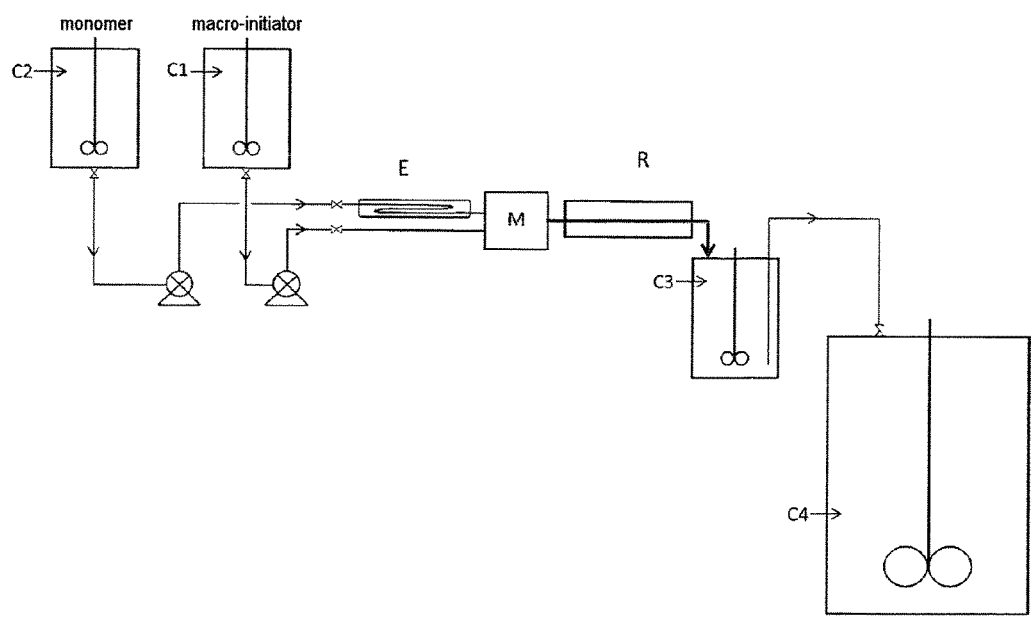
FIG. 1, a flow sheet of an example of polymerization installation that can be used, FIGS. 2A and 2B, curves showing the molecular weight of the PS block in several PS-b-PMMA block copolymers that were synthesized according to a conventional method, or in a controlled manner according to the invention.

The term "monomer" as used here relates to a molecule that can undergo polymerization.

The term "polymerization" as used here relates to the method of transforming a monomer or a mixture of monomers into a polymer.

"Copolymer block" or "block" means a polymer combining several monomer units of several types, or of one and the same type.

"Block copolymer" means a polymer comprising at least two blocks as defined above, the two blocks being different from one another and having a phase segregation parameter such that they are not miscible and separate into nanodomains for a given temperature and a given chain length.

The term "miscibility" used above is to be understood as the ability of two compounds to mix completely to form a homogeneous phase.

Period, designated Lo, means the minimum distance separating two neighbouring domains of the same chemical composition, separated by a domain with a different chemical composition.

In the description, when talking of the molecular weight of a block, it is the peak molecular weight Mp, measured by size exclusion chromatography (SEC).

"Polar" solvent or monomer or block means a solvent or monomer or block selected from solvents, monomers or blocks or mixtures, having Hansen solubility parameters, calculated at 25° C., such that $\delta_{tot}=\delta_D+\delta_P+\delta_H<22.0$ MPa.

The physicochemical dissolution properties, also called capacities for solvation, of the various solvents, or mixtures of solvents, can be calculated according to the approach proposed by Charles Hansen in the work with the title "Hansen Solubility Parameters: A user's handbook", Second Edition (2007) Boca Raton, Fla.: CRC Press. ISBN 978-O-8493-7248-3. According to this approach, three parameters, called "Hansen parameters": $\delta_D$, $\delta_P$, $\delta_H$, are sufficient for predicting the behavior of a solvent with respect to a given molecule. The parameter $\delta_D$, in MPa$^{0.5}$, quantifies the energy of the forces of dispersion between the molecules, i.e. the van der Waals forces. The parameter $\delta_P$, in MPa$^{0.5}$, represents the energy of the intermolecular dipolar interactions. Finally, the parameter $\delta_H$, in MPa$^{0.5}$, quantifies the energy derived from the intermolecular hydrogen bonds, i.e. the capacity to interact via a hydrogen bond. The sum of the squares of the three parameters corresponds to the square of the Hildebrand solubility parameter ($\delta_{tot}$).

Table I below lists solvents, and mixtures of solvents, and their Hansen solubility parameters calculated for a temperature equal to 25° C.

TABLE I

| No. | solvent | Hansen parameter (MPa) | | | |
|---|---|---|---|---|---|
| | | δD | δP | δH | Σ |
| 1 | acetic acid | 14.5 | 8 | 13.5 | 36 |
| 2 | acetone | 15.5 | 10.4 | 7 | 32.9 |
| 3 | acetonitrile | 15.3 | 18 | 6.1 | 39.4 |
| 4 | anisole | 17.8 | 4.1 | 6.8 | 28.7 |
| 5 | n-butyl acetate | 15.8 | 3.7 | 6.8 | 25.8 |
| 6 | chloroform | 17.8 | 3.1 | 5.7 | 26.6 |
| 7 | cyclohexanone | 17.8 | 6.3 | 5.1 | 29.2 |
| 8 | ethyl ethyl ketone | 15.8 | 7.6 | 4.7 | 28.1 |
| 9 | dimethylsulfoxide | 18.4 | 16.4 | 10.2 | 45 |
| 10 | N,N-dimethylformamide | 17.4 | 13.7 | 11.3 | 42.4 |
| 11 | ethyl acetate | 15.8 | 5.3 | 7.2 | 28.3 |
| 12 | L-ethyl lactate | 16 | 7.6 | 12.5 | 36.1 |
| 13 | methanol | 15.1 | 12.3 | 22.3 | 49.7 |
| 14 | N-methyl-2-pyrrolidone | 18 | 12.3 | 7.2 | 37.5 |
| 15 | toluene | 18 | 1.4 | 2 | 21.4 |
| 16 | isopropyl alcohol | 15.8 | 6.1 | 16.4 | 38.3 |
| 17 | ethanol | 15.8 | 8.8 | 19.4 | 44 |
| 18 | γ-butyrolactone | 19 | 16.5 | 7.3 | 42.8 |
| 19 | methyl-isobutyl ketone | 15.3 | 6.1 | 4.1 | 25.5 |
| 20 | propylene glycol monomethyl ether | 15.6 | 6.3 | 11.6 | 33.5 |
| 21 | dichloromethane | 17 | 7.3 | 7.1 | 31.4 |
| 22 | benzonitrile | 17.4 | 9 | 3.3 | 29.7 |
| 23 | benzyl alcohol | 18.4 | 6.3 | 13.7 | 38.4 |
| 24 | n-pentyl acetate | 15.3 | 3.1 | 7 | 25.4 |
| 25 | butan-1-ol | 15.8 | 5.7 | 14.5 | 36 |
| 26 | N,N-dimethylacetamide | 16.7 | 11.45 | 10.22 | 38.37 |
| 27 | methyl ethyl ketone | 16 | 9 | 5.1 | 30.1 |

TABLE I-continued

| No. | solvent | Hansen parameter (MPa) | | | |
|---|---|---|---|---|---|
| | | δD | δP | δH | Σ |
| 28 | pentan-2-one | 15.8 | 8.2 | 10.8 | 34.8 |
| 31 | octan-1-ol | 17 | 3.3 | 11.9 | 32.2 |
| 32 | (R,S) octan-2-ol | 16.2 | 4.9 | 11 | 32.1 |
| 33 | 4-methyl-2-pentanol | 15.27 | 3.27 | 12.3 | 30.84 |
| 34 | 2-ethyl-hexanol | 15.9 | 3.27 | 11.86 | 31.03 |
| 35 | propylene glycol monomethyl ether acetate | 16.1 | 6.1 | 6.6 | 28.8 |

"Aprotic" means a solvent that does not have a hydrogen capable of reacting with the initiator used in polymerization.

As examples of aprotic nonpolar solvent, we may mention benzene, toluene, and ethylbenzene.

As examples of polar aprotic solvent, we may mention tetrahydrofuran, and anisole.

The principle of the invention consists of controlling the properties of the block copolymers of the nonpolar—b—polar type, for example of PS-b-PMMA, and notably the shape, the dimensions and the period of the nanodomains so as to be able to synthesize them reproducibly and use them as masks in methods of nanolithography by direct self-assembly (DSA).

For this, anionic synthesis of the block copolymer is carried out by a semicontinuous method in an aprotic nonpolar medium, and more particularly in toluene. Synthesis of the first nonpolar block is carried out beforehand, in the form of a macro-initiator. Then the polar block is synthesized by a continuous method.

The constituent monomers of the block copolymers (at least two in number) will be selected from the vinyl, vinylidene, diene, olefinic, allylic (meth)acrylic or cyclic monomers. These monomers are selected more particularly from the aromatic vinyl monomers such as styrene or the substituted styrenes, notably alpha-methylstyrene, the silylated styrenes, the acrylic monomers such as the alkyl, cycloalkyl or aryl acrylates such as methyl, ethyl, butyl, ethylhexyl or phenyl acrylate, the etheralkyl acrylates such as 2-methoxyethyl acrylate, the alkoxy- or aryloxy-polyalkylene glycol acrylates such as the methoxypolyethylene glycol acrylates, the ethoxypolyethylene glycol acrylates, the methoxypolypropylene glycol acrylates, the methoxy-polyethylene glycol-polypropylene glycol acrylates or mixtures thereof, the aminoalkyl acrylates such as 2-(dimethylamino)ethyl acrylate (ADAME), the fluorinated acrylates, the silylated acrylates, the phosphorus-containing acrylates such as the alkylene glycol phosphate acrylates, the glycidyl acrylates, dicyclopentenyloxyethyl acrylates, the alkyl, cycloalkyl, alkenyl or aryl methacrylates such as methyl methacrylate (MAM), lauryl, cyclohexyl, allyl, phenyl or naphthyl methacrylates, the etheralkyl methacrylates such as 2-ethoxyethyl methacrylate, the alkoxy- or aryloxy-polyalkylene glycol methacrylates such as methoxypolyethylene glycol methacrylates, the ethoxypolyethylene glycol methacrylates, the methoxypolypropylene glycol methacrylates, the methoxy-polyethylene glycol-polypropylene glycol methacrylates or mixtures thereof, the aminoalkyl methacrylates such as 2-(dimethylamino)ethyl methacrylate (MADAME), the fluorinated methacrylates such as 2,2,2-trifluoroethyl methacrylate, the silylated methacrylates such as 3-methacryloylpropyltrimethylsilane, the phosphorus-containing methacrylates such as the alkylene glycol phosphate methacrylates, hydroxyethylimidazolidone methacrylate, hydroxyethylimidazolidinone methacrylate, 2-(2-oxo-1-imidazolidinyl)ethyl methacrylate, acrylonitrile, acrylamide or the substituted acrylamides, 4-acryloylmorpholine, N-methylolacrylamide, methacrylamide or the substituted methacrylamides, N-methylolmethacrylamide, methacrylamidopropyltrimethyl ammonium chloride (MAPTAC), the glycidyl and dicyclopentenyloxyethyl methacrylates, maleic anhydride, the alkyl or alkoxy- or aryloxypolyalkylene glycol maleates or hemimaleates, vinylpyridine, vinylpyrrolidinone, (alkoxy) poly(alkylene glycol) vinyl ether or divinyl ether, such as methoxy polyethylene glycol) vinyl ether, polyethylene glycol) divinyl ether, the olefinic monomers, among which we may mention ethylene, butene, hexene and 1-octene, the diene monomers including butadiene, isoprene as well as the fluorinated olefinic monomers, and the vinylidene monomers, among which we may mention vinylidene fluoride, the lactones, lactides, glycolides, cyclic carbonates, siloxanes, if necessary protected so as to be compatible with the methods of anionic polymerization, alone or mixed with at least two aforementioned monomers.

"Nonpolar monomers" means more particularly the vinyl, vinylidene, diene, olefinic, allyl monomers. These monomers are selected more particularly from the aromatic vinyl monomers such as styrene or the substituted styrenes, notably alpha-methylstyrene, or the silylated styrenes, the olefinic monomers, among which we may mention ethylene, butene, hexene and 1-octene, the diene monomers including butadiene, isoprene as well as the fluorinated olefinic monomers, and the vinylidene monomers, among which we may mention vinylidene fluoride.

"Polar monomers" means more particularly the acrylic monomers such as the alkyl, cycloalkyl or aryl acrylates such as methyl, ethyl, butyl, ethylhexyl or phenyl acrylate, the etheralkyl acrylates such as 2-methoxyethyl acrylate, the alkoxy- or aryloxy-polyalkylene glycol acrylates such as the methoxypolyethylene glycol acrylates, the ethoxypolyethylene glycol acrylates, the methoxypolypropylene glycol acrylates, the methoxypolyethylene glycol-polypropylene glycol acrylates or mixtures thereof, the aminoalkyl acrylates such as 2-(dimethylamino)ethyl acrylate (ADAME), the fluorinated acrylates, the silylated acrylates, the phosphorus-containing acrylates such as the alkylene glycol phosphate acrylates, the glycidyl acrylates, dicyclopentenyloxyethyl acrylates, the alkyl, cycloalkyl, alkenyl or aryl methacrylates such as methyl methacrylate (MAM), lauryl, cyclohexyl, allyl, phenyl or naphthyl methacrylates, the etheralkyl methacrylates such as 2-ethoxyethyl methacrylate, the alkoxy- or aryloxy-polyalkylene glycol methacrylates such as the methoxypolyethylene glycol methacrylates, the ethoxypolyethylene glycol methacrylates, the methoxypolypropylene glycol methacrylates, the methoxy-polyethylene glycol-polypropylene glycol methacrylates or mixtures thereof, the aminoalkyl methacrylates such as 2-(dimethylamino)ethyl methacrylate (MADAME), the fluorinated methacrylates such as 2,2,2-trifluoroethyl methacrylate, the silylated methacrylates such as 3-methacryloylpropyltrimethylsilane, the phosphorus-containing methacrylates such as the alkylene glycol phosphate methacrylates, hydroxyethylimidazolidone methacrylate, hydroxyethylimidazolidinone methacrylate, 2-(2-oxo-1-imidazolidinyl)ethyl methacrylate, acrylonitrile, acrylamide or the substituted acrylamides, 4-acryloylmorpholine, N-methylolacrylamide, methacrylamide or the substituted methacrylamides, N-methylolmethacrylamide, methacrylamido-propyltrimethyl ammonium chloride (MAPTAC), the glycidyl methacrylates, dicyclopentenyloxyethyl methacrylates, maleic anhydride, the alkyl or alkoxy- or aryloxypolyalkylene glycol maleates or hemimaleates, 2-vinylpyridine, 4-vinylpyridine, vinylpyrrolidinone, (alkoxy) poly(alkylene glycol) vinyl ether or divinyl ether, such as methoxy poly(ethylene glycol) vinyl ether, poly(ethylene glycol) divinyl ether, the olefinic monomers, among which we may mention ethylene, butene, hexene and 1-octene, the diene monomers including butadiene, isoprene as well as the fluorinated olefinic monomers, and the vinylidene monomers, among which we may mention vinylidene fluoride, the lactones, lactides, glycolides, cyclic carbonates, the siloxanes, if necessary protected so as to be compatible with the methods of anionic polymerization, alone or mixed with at least two aforementioned monomers.

Preferably the constituent monomers of the copolymers will be selected from the styrene or (meth)acrylic or vinylpyridine monomers, and more particularly, styrene and methyl methacrylate.

In the representative, but not exclusive case of a PS-b-PMMA, for synthesizing the first PS block in the form of a macro-initiator, polystyryllithium is prepared starting from styrene and n-butyllithium. To lower the reactivity of polystyryllithium so as to be able to initiate polymerization of the MAM (methyl methacrylate) monomer without touching its carbonyl group, preferably a DPE (1,1-diphenylethylene) unit is used. The macro-initiator thus synthesized is a PS-DPEL (polystyrene-diphenylethyllithium).

It is preferable to use more than one DPE equivalent to one polystyryllithium equivalent so as to be assured of having at least one DPE equivalent at the polystyryllithium chain end. Accordingly, it is possible that a small amount of residual styrene may react with the DPE to form a styrene-DPE-styrene-DPE segment at the PS chain end, which will initiate the MAM monomer. At the end of their synthesis, the PS-b-PMMA block copolymers may therefore have between 1 and 3 DPE units in their chain.

In a polar medium, such as THF, at low temperature (<−70° C.), the lithiated PS-diphenylethyllithium (PS-DPEL) complex is dissociated, which allows an efficiency of initiation of the MAM monomer close to 100% as well as controlled dispersity.

However, in a nonpolar medium such as toluene at 0° C., the efficiency of initiation of the MAM monomer decreases to 80%. This lower efficiency of initiation implies the appearance of "dead" PS, i.e. which is not used for copolymerization and is recovered at the end in the solution comprising the PS-b-PMMA block copolymer. Moreover, owing to the side reactions that occur, notably attack of the carbonyl on the antepenultimate monomer unit, the dispersity increases. To overcome this problem of initiation, an alkali metal alcoholate is used. This alcoholate makes it possible to solvate the macro-initiator complex of PS-diphenylethyllithium, which has the effect of increasing the efficiency of initiation and decreasing the side reactions through the steric hindrance that is supplied.

The PS-DPEL macro-initiator complex previously synthesized is therefore mixed with an alkali metal alcoholate, preferably lithium methoxyethanolate, in toluene at a temperature below 0° C. The molar ratio of lithium methoxyethanolate/nonpolar macro-initiator (PS-DPEL) is between 1 and 10 and preferably it is equal to 6.

The PMMA block is then synthesized in the toluene medium at a temperature below 0° C. in the presence of this alcoholate, in order to decrease the dispersity and the side reactions. Preferably, a micro-mixer, arranged upstream of a polymerization reactor, makes it possible to bring the MAM and the macro-initiator together very quickly and thus decrease the side reactions and the dispersity of the PMMA block even more.

The two solutions previously prepared of macro-initiator/alcoholate in toluene at a temperature below 0° C. and of methyl methacrylate in toluene at a temperature below 0° C. are injected into the micro-mixer at a constant flow ratio. The mixture leaves the micro-mixer with a resultant flow rate and goes to the polymerization reactor.

The concentration of macro-initiator in the mixture from the micro-mixer is generally between 95 and 5 and the concentration of polar monomer (methyl methacrylate) is between 5 and 95. Preferably the concentration of macro-initiator in the mixture from the micro-mixer is between 95 and 50, and even more preferably between 85 and 50 and the concentration of polar monomer (methyl methacrylate) is preferably between 5 and 50, and even more preferably between 15 and 50.

The use of the alcoholate makes it possible, moreover, to obtain a PMMA block whose syndiotacticity is comparable to that of a PMMA synthesized in THF at low temperature, below −70° C. The PMMA block in fact has a syndiotactic triad level measured by proton NMR between 70 and 80%.

Finally, once all of the MAM monomers have reacted, the side reactions become predominant. The PS-b-PMMA block copolymer obtained has the growth of the PMMA chains stopped by the attack of the carbonyl on the antepenultimate MAM monomer unit. This reaction is promoted all the more because, owing to the exothermic effect of the polymerization reaction of MAM, the temperature of the reaction mixture has increased.

At the application level, the applicant found that the PS-b-PMMA block copolymers synthesized in a controlled manner by the method described above self-assemble into a thin film with nanodomains of cylindrical or lamellar shape depending on the particular compositions of the copolymers and notably depending on the ratios between the nonpolar blocks of PS and polar blocks of PMMA.

In fact, whereas the PS-b-PMMA copolymers synthesized conventionally by anionic reaction in THF at low temperature (<−70° C.) self-assemble in the form of lamellae for compositions of PS/PMMA close to 50/50 and in the form of cylinders of PMMA for compositions of the order of 70/30, the applicant found that with the block copolymers synthesized in a controlled manner in toluene at −20° C., it becomes possible to obtain lamellae for weight ratios of PS/PMMA between 35/65 and 60/40 and cylinders of PMMA for weight ratios of PS/PMMA in the range of values between 64/36 and 75/25.

The following examples illustrate the scope of the invention nonexhaustively:

Example 1: Controlled Synthesis of PS-b-PMMA

The polymerization installation used is shown schematically in FIG. 1. A solution of the macro-initiating system is prepared in a vessel C1 and a solution of the monomer in a vessel C2. The stream from vessel C2 is sent to an exchanger E to be adjusted to the initial polymerization temperature. The two streams are then sent to a mixer M, which in this example is a micro-mixer, as described in patent application EP0749987, then to the polymerization reactor R, which is a usual tubular reactor. The product is received in a vessel C3 and is then transferred to a vessel C4, where it is precipitated.

In vessel C1, a solution of the macro-initiator system poly(styryl)$CH_2C(PH)_2Li/CH_3OCH_2CH_2OLi$ of molar ratio 1/6 at $9.8\times10^{-2}$ mol of poly(styryl)$CH_2C(PH)_2Li$, as described in EP0749987 and EP0524054, is prepared at 21.1 wt % in toluene at 45° C.

In vessel C2, a solution of MAM that has passed through a molecular sieve at 9 wt % in toluene is stored at −15° C.

The level of final copolymer aimed at is 16.6 wt %. Vessel C1 is cooled to −20° C. and the flow of the solution of the macro-initiator system is set at 60 kg/h. The flow of the solution of MAM from vessel C2 is sent to an exchanger so that the temperature is lowered to −20° C. there and the flow of the solution of MAM is set at 34.8 kg/h. The two streams are then mixed in the random mixer and then recovered in a vessel C3, where the copolymer is deactivated completely by adding a solution of methanol.

The conversion, determined by measuring the proportion of solids, is above 99%.

When the level of PS homopolymer is too high, which may occur when initiation is not yet sufficiently effective, an additional step consists of purifying the PS-b-PMMA block copolymer previously synthesized. For this, the contents of vessel C3 are precipitated dropwise into a vessel C4 with stirring. The vessel contains a 80/20 mixture by volume of cyclohexane/heptane and the volume ratio between the contents of vessel C3 and of C4 is 1/7. At the end of addition of the solution from vessel C3, stirring is stopped and the block copolymer sediments. It is then recovered by removal of the supernatant and filtration. The cyclohexane/heptane ratio makes it possible to modulate the amount of homopolymer in the mixture. A mixture of polymers only containing traces of PS homopolymer is obtained in the precipitated portion.

After drying, the characteristics of the block copolymer are as follows:

Mn=61.4 kg/mol
Mw/Mn=1.09
Weight ratio PS/PMMA=66.3/33.7

The measurements are performed by SEC (size exclusion chromatography). For this, the polymers are dissolved at 1 g/l in THF stabilized with BHT (2,6-bis(1,1-dimethylethyl)-4-methylphenol). Calibration is performed with standards of monodisperse polystyrene. Double detection by refractive index and UV at 254 nm makes it possible to determine the percentage polystyrene in the copolymer. The exact composition of the copolymer is determined by $^1H$ NMR on a Bruker 400 instrument, by integrating the aromatic protons of styrene (5) and the methoxy protons of PMMA (3).

Example 2: Control Cards

Figure 2A:
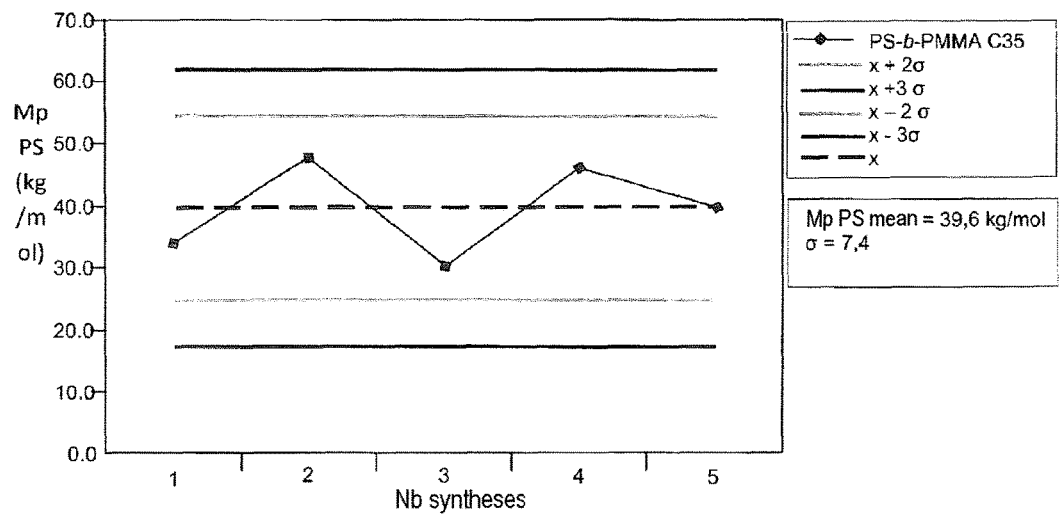
Figure 2B:
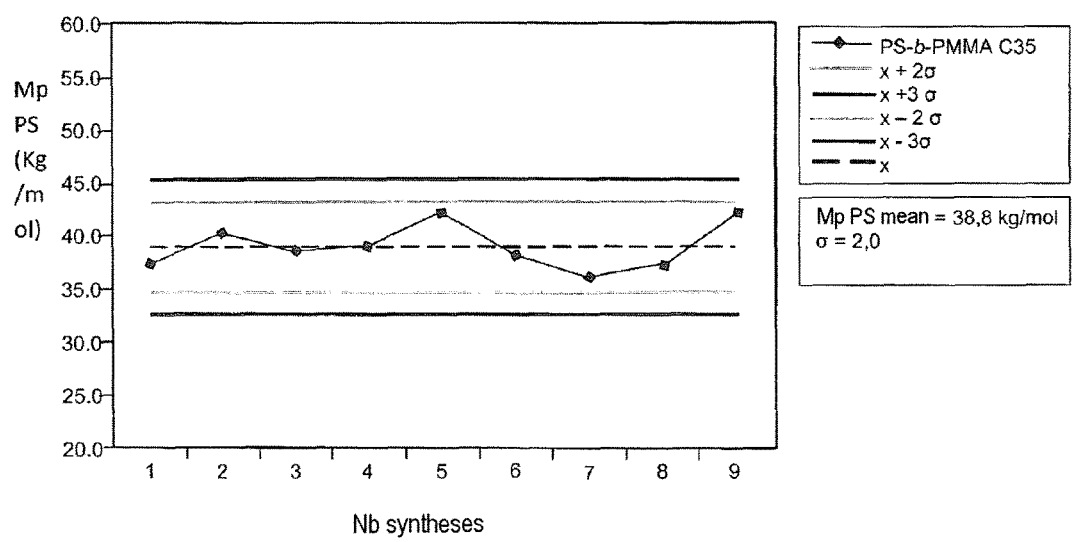

FIGS. 2A and 2B show the molecular weight of the PS block in PS-b-PMMA block copolymers synthesized by the conventional method in THF at −78° C. and in a controlled manner in toluene at −20° C., respectively. Several copolymers were synthesized according to these two methods in order to demonstrate that synthesis in the toluene medium at −20° C. gives better control of synthesis of the various blocks and therefore better reproducibility of the block copolymers, so that this controlled synthesis makes it possible to envisage synthesis of such copolymers for use as masks in DSA applications.

The copolymers synthesized and compared are copolymers whose nanodomains have a cylindrical morphology of period $L_0$ equal to 35 nm.

The peak molecular weight Mp of the PS block of each copolymer synthesized was measured by SEC (size exclusion chromatography).

FIG. 2A presents the molecular weight of the PS block determined for each copolymer obtained according to a conventional synthesis. FIG. 2B presents the molecular weight of the PS block determined for each copolymer obtained according to controlled synthesis in toluene at −20° C.

The value σ represents the standard deviation of the measurements.

The copolymers of PS-b-PMMA synthesized conventionally in THF at −78° C. have an average molecular weight of PS of 39.6 kg/mol and a standard deviation of 7.4.

The copolymers of PS-b-PMMA synthesized in a controlled manner in toluene at −20° C. have an average molecular weight of PS of 38.8 kg/mol and a standard deviation of 2.

It can be seen from these figures that the standard deviation is greater in the case of the copolymers synthesized according to the conventional route. Synthesis in the toluene medium at −20° C. consequently gives better control of the copolymers obtained and better control of their properties. They can therefore be synthesized reproducibly and can be used industrially in DSA applications.

What is claimed is:

1. A method for controlling the synthesis of a block copolymer containing at least two blocks, with at least one nonpolar block and at least one polar block, said method making it possible in particular to control the weight ratio between the blocks and the molecular weight of each of the blocks, said block copolymer being a block copolymer suitable for use as a mask in a method of nanolithography by direct self-assembly (DSA), said control being achieved by semicontinuous anionic polymerization in an aprotic nonpolar medium and comprising the following steps:
    synthesizing a nonpolar block in the form of a macro-initiator;
    preparing a first solution of said macro-initiator previously synthesized by mixing the macro-initiator with an alkali metal alcoholate in a first aprotic nonpolar solvent;
    preparing a second solution of a polar monomer in a second aprotic nonpolar solvent, which may be the same as or different from the first aprotic nonpolar solvent;
    injecting the first solution and the second solution into a micro-mixer, connected to a polymerization reactor, at a constant flow ratio and carrying out polymerization of the polar monomer to obtain the block copolymer;
    recovering the block copolymer obtained.

2. The method as claimed in claim 1, wherein the constituent monomers of the block copolymer are selected from aromatic vinyl monomers, (meth)acrylic monomers, 2-vinylpyridine and 4-vinylpyridine.

3. The method as claimed in claim 1, wherein the constituent monomer of the nonpolar block is styrene and the polar monomer is methyl methacrylate.

4. The method as claimed in claim 1, wherein a polymerization initiator is used to synthesize the macro-initiator and the polymerization initiator is n-butyllithium.

5. The method as claimed in claim 1, wherein the first aprotic nonpolar solvent and the second aprotic nonpolar solvent are the same and are each toluene or ethylbenzene.

6. The method as claimed in claim 1, wherein the alkali metal alcoholate is lithium methoxyethanolate.

7. The method as claimed in claim 6, wherein the molar ratio of lithium methoxyethanolate/macro-initiator is between 1 and 10.

8. The method as claimed in claim 6, wherein the molar ratio of lithium methoxyethanolate/macro-initiator is equal to 6.

9. The method as claimed in claim 1, wherein mixing of the first solution and the second solution in the micro-mixer produces a mixture and the weight concentration of macro-initiator in the mixture is between 95 and 5 percent and the weight concentration of polar monomer is between 5 and 95 percent.

10. The method as claimed in claim 1, wherein mixing of the first solution and the second solution in the micro-mixer produces a mixture and the weight concentration of macro-initiator in the mixture is between 95 and 50 percent and the weight concentration of polar monomer is between 5 and 50 percent.

11. The method as claimed in claim 1, wherein mixing of the first solution and the second solution in the micro-mixer produces a mixture and the weight concentration of macro-initiator in the mixture is between 85 and 50 percent and the weight concentration of polar monomer is between 15 and 50 percent.

12. The method as claimed in claim 1, wherein the block copolymer is a PS-b-PMMA copolymer, the nonpolar block is in the form of a macro-initiator of PS-diphenylethyl-lithium (PS-DPEL) and more than one equivalent of diphenylethylene (DPE) is used to one equivalent of polystyryl-lithium, in the step of preparing said macro-initiator of PS-DPEL.

13. The method as claimed in claim 12, additionally comprising a step of purifying the PS-b-PMMA block copolymer obtained which is carried out by dropwise precipitation of a solution of methanol containing said block copolymer obtained, into a solution containing an 80/20 mixture by volume of cyclohexane/heptane, then recovery of the purified block copolymer by removal of the supernatant and filtration.

14. A method, comprising the following steps:
    synthesizing a nonpolar block in the form of a macro-initiator;
    preparing a first solution of said macro-initiator previously synthesized by mixing the macro-initiator with an alkali metal alcoholate in a first aprotic nonpolar solvent;
    preparing a second solution of a polar monomer in a second aprotic nonpolar solvent, which may be the same as or different from the first aprotic nonpolar solvent;
    injecting the first solution and the second solution into a micro-mixer, connected to a polymerization reactor, at a constant flow ratio to produce a mixture which undergoes anionic polymerization of the polar monomer to obtain a block copolymer containing at least two blocks, with at least one nonpolar block and at least one polar block;
    recovering the block copolymer obtained; and
    using the block copolymer as a mask in a method of nanolithography by direct self-assembly (DSA).

* * * * *